United States Patent [19]

Redman

[11] 3,958,121

[45] May 18, 1976

[54] INFRARED IMAGE STORAGE PLATE

[75] Inventor: Charles M. Redman, Las Cruces, N. Mex.

[73] Assignee: The United States of America as represented by the Secretary of the Army, Washington, D.C.

[22] Filed: Sept. 10, 1975

[21] Appl. No.: 612,065

[52] U.S. Cl. ............................................. 250/330
[51] Int. Cl.² ........................................ H01J 31/49
[58] Field of Search ........... 250/330, 333, 334, 338, 250/340, 342

[56] References Cited
UNITED STATES PATENTS

| | | | |
|---|---|---|---|
| 3,919,555 | 11/1975 | Singer | 250/330 X |
| 3,930,157 | 12/1975 | Watton | 250/330 |

Primary Examiner—Davis L. Willis
Attorney, Agent, or Firm—Nathan Edelberg; Robert P. Gibson; Saul Elbaum

[57] ABSTRACT

An Infrared Image Storage Plate for displaying and/or recording infrared images having photon energy levels which are generally insufficient to release electrons from photocathode materials is described. The image storage plate includes a multi-layered structure, beginning from the face of incident infrared radiation: a conducting grid; a photoconductor layer; a layer of P type semi-conductor material having N type semiconductor islands thereon; a layer of dielectric material over the N type islands; a deformographic film; and a thin film of conductive material. To store an image therein a positive potential is applied to the thin conductive film and a negative potential is applied to the conductive grid. Upon the receipt of incident infrared radiation electrons are released from the photoconductor layer and are integrated by the PN junctions in the semiconductor material to thereby deform the deformographic film in accordance with the incident infrared image. The image stored by the deformographic film can be projected for viewing or stored on a photographic film by use of a Schlieren Optical System. The image stored in the plate may be erased by reversing the potential applied thereto.

10 Claims, 4 Drawing Figures

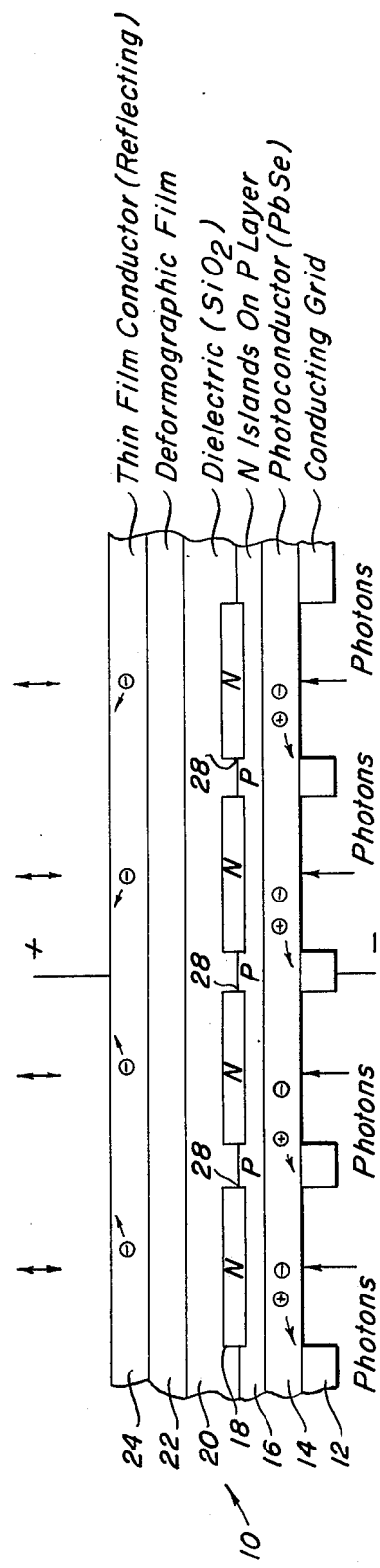
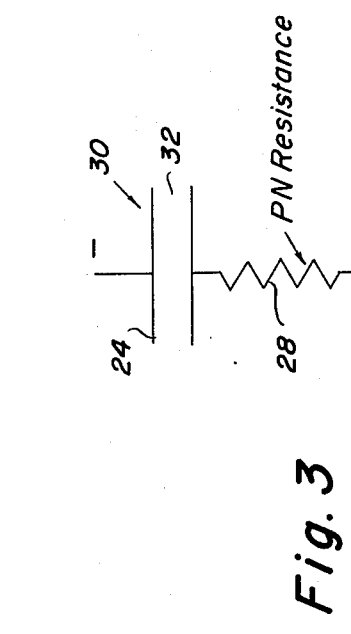
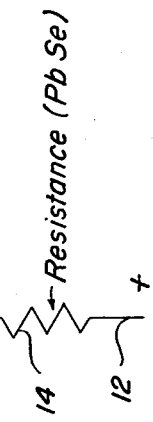
Fig. 1
Fig. 2
Fig. 3

INFRARED IMAGE STORAGE PLATE

RIGHTS OF GOVERNMENT

The invention described herein may be manufactured, used, and licensed by or for the United States Government for governmental purposes without the payment to me of any royalty thereon.

BACKGROUND OF INVENTION

1. Field of Invention

The present invention relates to the display or recording of infrared images. More specifically, the present invention relates to a storage plate for temporarily storing infrared radiation images for subsequent projection onto a display screen or photographic film.

2. Description of Prior Art

Heretofore infrared images have been recorded or viewed through scanning devices or devices employing photocathodes in conventional optical image intensifiers.

Scanning devices suffer from the disadvantage of being too slow, particularly where the infrared images are from rapidly moving sources such as aircraft or missiles.

Optical image intensifiers suffer from the limitations of the photocathodes therein. For example, the operation of present photocathodes are limited to photons (short wavelengths) with sufficient energy to cause release of electrons from the photocathode material to surrounding areas. Longer wavelengths, such as (2 to 5 microns) in the infrared range, can cause the the creation of electron-hole pairs but are of insufficient photon energy to cause the release of electrons from the photocathode material. Accordingly, the use of conventional optical image intensifiers is seriously limited by the characteristics of the photocathodes therein, when it is attempted to use the same for imaging infrared images.

SUMMARY OF THE INVENTION

Accordingly, it is an object of the present invention to provide a means for efficiently displaying and/or recording infrared images.

It is a further object of the present invention to provide an infrared image storage device which can store infrared images from fast moving objects such as aircraft or missiles.

It is still a further object of the present invention to provide a means for storing an infrared image having a photon energy level which is generally insufficient to release electrons from conventional photocathodes employed in optical image intensifiers.

These and other objects of the present invention are fulfilled by providing an Infrared Image Storage Plate hereinafter referred to as an IRISP. The storage plate comprises a multilayered structure sandwiched between two conductive electrodes to which a bias potential is applied. With a bias of a first polarity applied across the plate, the plate is conditioned for receiving and storing an infrared image therein. By reversing the bias potential the stored image may be erased.

The IRISP, as stated above includes a multilayered structure, said layers being arranged beginning from the side of incident infrared radiation as follows: an electrically conductive grid; a photoconductor layer of a material such as PbSe; a layer of P type semiconductor material having N type semiconductor islands thereon; a layer of dielectric material such as $SiO_2$ over the N type islands; a deformographic film which is typically a polymer of rubber; and a thin film of conductive material which is optically reflective and deforms with the deformographic film.

To store an image in the IRISP a positive potential is applied to the thin conductive film and a negative potential is applied to the conductive grid. Upon the receipt of an incident infrared radiation image electrons migrate through the photoconductor layer and are integrated by the PN junctions in the semiconductor material to thereby deform the deformographic film in accordance with the incident infrared image. The image stored by the deformographic film can be projected for viewing or stored on a photographic film by use of a Schlieren Optical System. The image stored in the plate may be erased by reversing the potential applied thereto.

In a preferred embodiment the stored image is projected onto a viewing screen or photographic film by a Schlieren Optical System. Visible light is reflected from the reflective thin conductor overlying the deformographic film through the Schlieren System to reproduce the stored image therein.

BRIEF DESCRIPTION OF DRAWINGS

The objects of the present invention and the attendant advantages thereof will become more readily apparent by reference to the following drawings wherein like numerals refer to like parts and the respective figures illustrate the following:

FIG. 1 is a side elevational view in section illustrating the infrared image storage plate of the present invention;

FIG. 2 is an electronic schematic or equivalent circuit of the storage plate of FIG. 1 illustrating the condition of the plate during the image storing mode;

FIG. 3 is an electronic schematic or equivalent circuit of the storage plate of FIG. 1 illustrating the condition of the plate during the erasing mode.

DETAILED DESCRIPTION OF PREFERRED EMBODIMENTS

Figure 4:
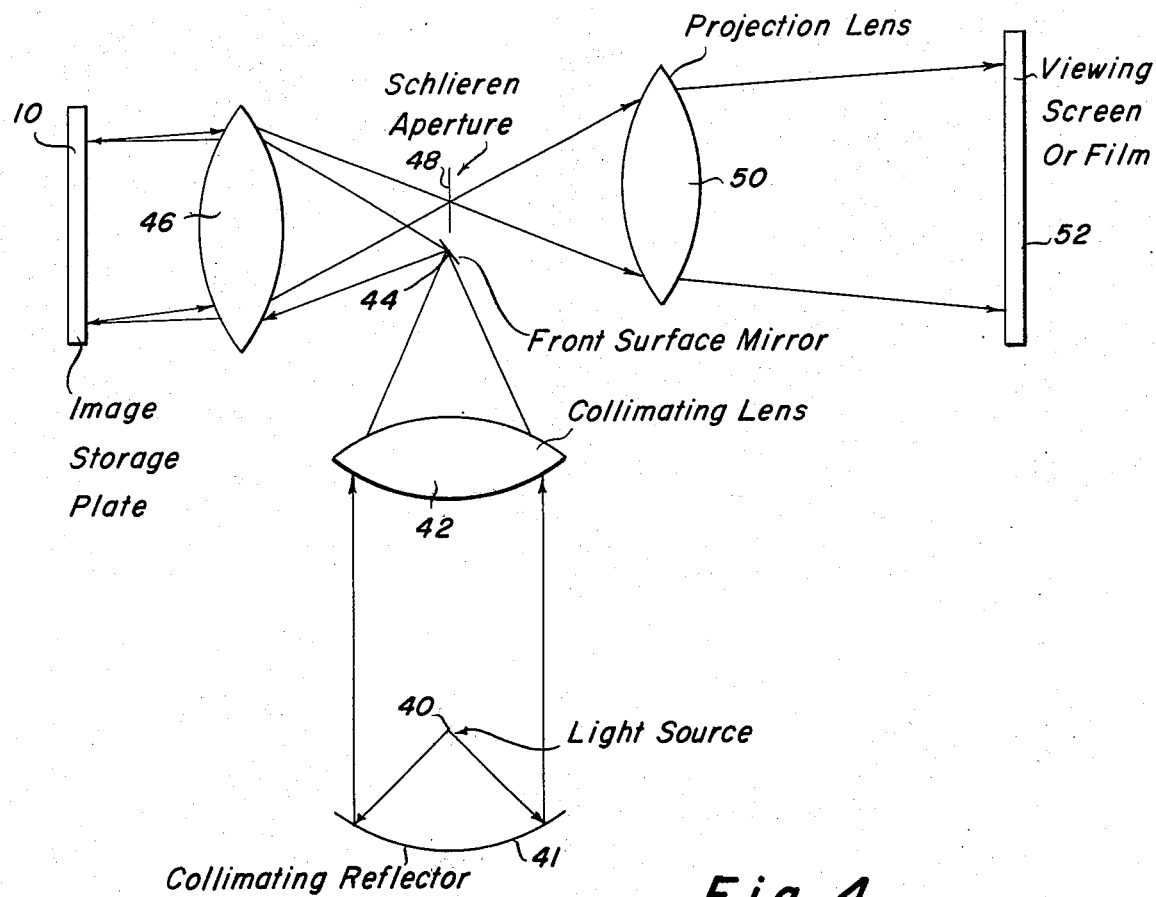
FIG. 4 is a diagramatic illustration of a projection system for projecting the image stored in the storage plate of FIG. 1.

Referring in detail to FIG. 1 there is illustrated an Infrared Image Storage Plate (IRISP) generally designated 10.

The heart of the device is a very thin plate 16 of P-type semiconductor material with N-type islands 18 grown, deposited, or formed thereon. Both sides of the semiconductor plate should be as flat as construction techniques will allow. The image resolution of the IRISP is directly related to the numbers of N-type islands per square cm. Television quality images would require approximately 400,000 islands per square cm. or a spacing of 63 per mm.

A thin film 14 of photoconducting material, such as PbSe, is deposited below the P-type semiconductor 16 and a fine conducting grid 12 below that. The photoconductor 14 and conducting grid 12 are disposed at the infrared image input side of the IRISP 10. Above the N-type islands 18 is a very thin film of dielectric 20 such as $SiO_2$ which is grown, deposited, or formed thereon. Disposed above dielectric 20 is deformographic film, such as a polymer of rubber, for storing the infrared image in a manner to be described hereinafter. The structure is completed by a thin electrically conductive and optically reflective layer 24 disposed on top of deformographic layer 22. Layer 24 is very thin and is bonded or secured to layer 22 in such a way that it deforms with deformographic layer 22 in accordance with the stored image.

Accordingly, IRISP 10 comprises a multilayered structure sandwiched between two conductive electrodes defining its respective faces i.e. conducting grid 12 and thin film conductor 24. An electrical biasing potential is applied across electrodes 12 and 24 with a polarity selected in accordance with the selection of a storage or erase mode of operation.

FIGS. 1 and 2 both show a bias potential polarity suitable for use with the storage mode of operation, that is a positive potential on electrode 24 and a negative potential on electrode 12.

The storage mode of operation can be understood by reference to FIG. 2 which is an electronic schematic or equivalent circuit of the IRISP 10 biased in the manner indicated in FIG. 1.

The output face or thin film reflector conductor 24 is common to all PN elements and is one plate of the capacitor 30 shown in FIG. 2. The deformographic and dielectric films 22, 20 are also common to all PN elements and form the capacitor dielectric 32. The deformographic film 22 is a fairly good insulator but not as good as the dielectric film 20 which is $SiO_2$ in the example shown. There is a separate N-type semiconductor island for each element forming PN diode interfaces 28 with the P-type semiconductor which is common to all PN elements. The photoconductor film 14 is also common to all PN elements and is a source of electron-hole pairs 26. The conducting grid 12 is also common to all PN elements. Only the N-type islands separate the IRISP into a large number of individual elements. The PN diodes 28 are back biased in FIGS. 1 and 2. A back biased diode PN diode functions as a capacitor whose capacitance depends on the construction and the magnitude of the biasing potential. Therefore, the equivalent circuit of FIG. 2 is two capacitors 28, 30 in series with a source of electron-hole pairs 26.

In operation photons from an infrared image striking the photoconductor 14 release electrons which migrate toward the plus potential and tend to stop at the PN interfaces between layers 16, 18. The holes migrate toward the negative side of the bias source. This unbalances the element circuit of FIG. 2 causing an equal number of electrons to go to the output face conducting film 24. The charge stored at the PN interface 28 increases and the charge in the capacitor 30 formed by the N type island 18 and thin film conductor 24 decreases. Thus, the deformographic film 22 deforms in proportion to the potential across it. This potential is in turn a function of the thicknesses of the dielectric and deformographic films, the initial charges stored, and the number of electrons generated in the photoconductor and held or stored at the PN interfaces.

As illustrated in FIG. 3 reversing the bias across the IRISP causes the PN interfaces 28 to become resistive instead of capacitive. The PN resistance 28 becomes almost a short circuit causing the capacitor 30 across the dielectric and deformographic films to be almost shorted across the potential source. This zeros or erases the IRISP and leaves a potential across the two films at some value which can be set to optimize the operation of the system. At this stage the photoconductor element 14 is equivalent to a resistor, as shown.

The operation of IRISP 10 of the present invention is thus illustrated in FIGS. 2 and 3. A typical sequence of operation is as follows:

1. A zeroing or forward bias is applied across electrodes 12, 24, as indicated in FIG. 3, to remove any existing images;
2. A reverse bias or image integrating voltage is applied across electrodes 12, 24, as indicated in FIGS. 1 and 2;
3. An infrared image of photons are caused to impinge upon photoconductor 14 thereby generating electron-hole pairs 26 which integrate across the PN junctions 28, dielectric 20, and deformographic film 22, thus storing an image in deformographic film 22; and
4. IRISP 10 is erased as in step (1) to complete the cycle.

The image stored in deformographic film 22 corresponds to the infrared image incident on photoconductor 14. It is of course only a latent image at this stage. In order to make the stored latent image visible, a Schlieren Optical Projection System is employed which will be described hereinafter with reference to FIG. 4.

Referring in detail to FIG. 4 there is illustrated a visible light source 40 is directed toward a collimating reflector 41. Collimated light from reflector 41 is directed through a collimating lens 42 which focuses said light at a point on a mirror 44. The light reflected from mirror 44 passes through a collimating lens 46 and illuminates the stored image in deformographic film 22. Light reflected from film 22 passes back through collimating lens 46 to a pin hole or Schileren aperture 48 at a small angle to the illumination directed toward the deformographic film. Light scattered by deformations does not pass through the pin hole 48. Therefore, the light which does pass carries an image of the deformations. This image is then projected by projection lens 50 on a screen, film, image intensifying or storage device 52, or a direct viewing sight. The contrast in the projected image is proportional to the magnitude of deformations on the deformographic film 22 which in turn is proportional to the contrast in the IR image.

The light source 40 shown in FIG. 2 can remain on continuously and the image erased and integrated as described above. The light can also be flashed on for a very short period of time to allow a framing action for changing images. This technique allows motion picture film to be made of IR images on constant motion film. That is the film would move continuously and smoothly instead of the move-hold and expose-move sequence of standard motion picture cameras. A typical sequence might be as follows:

1. Projection light off, IRISP forward biased.
2. Reverse bias image integrating pulse applied for 1.8ms.
3. Light source flashed for 1.8 microsecond just prior to end of integrating pulse.
4. Image erase for 0.2ms. This sequence would operate at 500 frames per second. Image smear due to continuous motion of film would be 0.1%.

The efficiency of the IRISP of the present invention is quite high as it makes use of most all of the electron-hole pairs generated by IR photons. With typical thicknesses of deformographic and dielectric films a charge density of $4 \times 10^{-8}$ coulombs per sq. cm. might be expected to produce a 30/1 contrast.

Typical sizes of elements and operating parameters could be as follows. A PN diode (assuming 400,000/cm²) would have about $2.25 \times 10^{-6}$ sq. cm. area. A 30/1 contrast would, therefore, require $9 \times 10^{-14}$ coulombs or $5.6 \times 10^5$ electrons. At 10% conversion efficiency from photon impact to stored electrons a 30/1 contrast would require $5.6 \times 10^6$ photons per element. Power per element is the number of photons times Planks constant times the cycles per second of radiation (5 micron radiation). A 1 second time of integration is assumed. Power = $5.6 \times 10^6 \times 6.6 \times 10^{-34} \times 6 \times 10^{13} = 22.2 \times 10^{-14}$ watts for a 1 second integration time for a 30/1 contrast. A one square inch IRISP would have $2.5 \times 10^6$ elements of the size used in the example. A 30/1 contrast would, therefore, require $2.22 \times 10^{-13} \times 2.5 \times 10^6$ or $5.55 \times 10^{-7}$ watts seconds. This can be related to the power in normal room lighting of 50 ft. candles or $5.2 \times 10^{-4}$ watts per sq. inch. IR illumination equivalent to normal room lighting would integrate a 30/1 contrast in one millisecond.

I wish it to be understood that I do not desire to be limited to the exact details of construction shown and described, for obvious modifications can be made by a person skilled in the art.

What is claimed is:

1. In a system for storing infrared radiation images, a device having a multilayered structure including an input face for receiving incident radiation images and an output face from which the stored images may be read out, said multilayered structure comprising:
   a first electrically conductive electrode defining said input face;
   means formed on said first electrode for forming electron-hole pairs in response to the receipt of said incident radiation images;
   a semiconductor element including a continuous P-type material facing said first electrode and a plurality of N-type islands thereon facing away from said first electrode, the interface between said P and N-type materials storing charge in response to the formation of electron-hole pairs;
   a dielectric coating covering said N-type islands;
   a deformographic film overlying said dielectric coating, said film deforming in response to electrical charge levels stored at the interfaces of said P and N-type materials;
   a second electrically conductive electrode overlying said deformographic film and defining the output face of said multilayered structure; and
   means for applying an electrical potential across said first and second electrodes.

2. The system of claim 1 wherein said first electrode is an electrically conductive grid structure.

3. The system of claim 1 wherein said means for forming electron-hole pairs comprises a layer of photoconductive material between said first electrode and said semiconductor element.

4. The system of claim 3 wherein said photoconductive material is PbSe.

5. The system of claim 1 wherein said second electrode is a very thin conductive and optically reflective material and is secured to said deformographic film in such a manner as to deform therewith in accordance with the image stored in said film.

6. The system of claim 5 wherein there is further provided means for converting the image stored on said deformographic film to a visible light image and projecting said image to a remote point.

7. The system of claim 6 wherein said means for converting and projecting comprises means for directing visible light against the reflective surface of said second electrode and means for projecting the reflection of said visible light to said remote point.

8. The system of claim 7 wherein said means for projecting comprises a Schlieren Optical System.

9. The system of claim 8 wherein there is further provided at said remote point, means for viewing the projected image.

10. The system of claim 8 wherein there is further provided at said remote point, means for recording the projected image.

* * * * *